United States Patent [19]

Iwahashi

[11] Patent Number: 4,891,830
[45] Date of Patent: Jan. 2, 1990

[54] X-RAY REFLECTIVE MASK AND SYSTEM FOR IMAGE FORMATION WITH USE OF THE SAME

[75] Inventor: Kenji Iwahashi, Kyoto, Japan

[73] Assignee: Shimadzu Corporation, Kyoto, Japan

[21] Appl. No.: 137,857

[22] PCT Filed: Mar. 24, 1987

[86] PCT No.: PCT/JP87/00177
    § 371 Date: Nov. 19, 1987
    § 102(e) Date: Nov. 19, 1987

[87] PCT Pub. No.: WO87/06028
    PCT Pub. Date: Oct. 8, 1987

[30] Foreign Application Priority Data

Mar. 28, 1986 [JP] Japan .................................. 61-71970
Mar. 31, 1986 [JP] Japan .................................. 61-74695

[51] Int. Cl.⁴ ........................... G03F 1/00; G03F 7/20
[52] U.S. Cl. ........................................... 378/35; 378/34
[58] Field of Search .................. 378/34, 35, 145, 84; 430/5

[56] References Cited

U.S. PATENT DOCUMENTS

| | | | |
|---|---|---|---|
| 3,772,522 | 11/1973 | Hammond et al. | 378/84 |
| 4,192,994 | 3/1980 | Kastner | 378/145 |
| 4,231,657 | 4/1980 | Takasu et al. | 378/35 |
| 4,411,013 | 10/1983 | Takasu et al. | 378/35 |

FOREIGN PATENT DOCUMENTS

| | | | |
|---|---|---|---|
| 0048174 | 4/1979 | Japan | 378/34 |
| 0055077 | 6/1982 | Japan . | |

OTHER PUBLICATIONS

Matsumura et al., "Demagnified Projection Printing by a New X-ray Lithographic Technique Using no Thin Film Masks", applied Physics Letters, pp. 3-5, Jul. 1, 1984.
IBM Technical Disclosure Bulletin, vol. 16, No. 9, Feb., 1974, Feder et al., "Ultrafine Line Projection System", pp. 3121-3122.

Primary Examiner—Janice A. Howell
Assistant Examiner—Joseph A. Hynds
Attorney, Agent, or Firm—Armstrong, Nikaido, Marmelstein, Kubovcik & Murray

[57] ABSTRACT

X-ray lithography which has been applied, for instance, to reproduction of a pattern for integrated electronic circuit wherein the proximity method is prevailed with use of a transmissive patterned mask. But this conventional method is defective for instance, in difficulty of dimensional reduction from an original pattern. In contrast, the disclosed invention overcomes such defect by introducing an X-ray reflective mask element, instead of conventional type of transmission. The reflective mask element is comprised of a crystalline substrate to reflect incident X-ray according to the Bragg's diffraction rule, which was worked out of a crystalline body having outwardly curved lattice surfaces, wherein the substrate face is formed to have an inclination against the lattice surfaces so that reflection at center of the substrate face will converge to a point on normal line assumed at the same center. Another aspect of the disclosure herein is directed to a system for X-ray projection and image formation with use of said mask element, additionally comprising an X-ray source, a Fresnel zone plate.

2 Claims, 2 Drawing Sheets

X-RAY REFLECTIVE MASK AND SYSTEM FOR IMAGE FORMATION WITH USE OF THE SAME

TECHNICAL FIELD

This invention relates to a reflective mask element which will be suitably applied to submicron-level lithography by X-ray projection and a system for image formation with use of the same.

BACKGROUND ART

Conventionally, in the process of manufacture of LSI, optical lithography technology has normally been applied for reproduction of a pattern drawn on a mask. But the optical lithography technology is known to reach its patterning limit up to 0.5 $\mu$m and besides, because of effect of Fresnel diffraction and shortness of focal distance, formation of a more compact pattern with less than 1 $\mu$m requires introduction of a multilayer resist and CEL process. On account of such, the process involved becomes complicated and results in a low product yield, which leads to an assessment that such a method will come to end in the near future. Probable replacing new methods are thought to be the direct drawing with electron beam and X-ray lithography. Wherein, the direct drawing with electron beam is defective in throughput, accuracy of stage connection and inevitable introduction of multi-layer resist to attain a height aspect ratio. In contrast, the X-ray lithography is based on image copy or transfer, for which it is advantageous to mass reproduction and it is also based on use of a ray having several angstroms to several tens of angstroms in wavelength, for which the effect of undesirable diffraction may be disregarded in substance and resolution thereby is expected to reach up to 0.1 $\mu$m.

The X-ray lithography includes, simply classed, two methods. One is a method that is presently prevailed, proxim method which comprises X-ray exposure in a proximate distance of about 10 $\mu$m between a mask and a wafer to transfer a pattern on the mask. Another one is X-ray projection and exposure method which transmits a pattern shadow to a wafer with aid of an X-ray imaging device.

DISCLOSURE OF THE INVENTION

This invention is firstly concerned with a mask element which is applied in the latter of the X-ray projection and exposure method. But the inventive mask element is different, as will be described in detail below, from conventional masks of transmission type. Avoidance of that type comes from, briefly noted, that X-ray used normally in the X-ray lithography has several angstroms to several tens of angstroms in wavelength or soft X-ray and impediment involved therein is that, because an X-ray of such wave range is easy to be absorbed by general materials, a mask substrate for such an X-ray should be an extremely thin membrane having several $\mu$m in thickness made of X-ray transmissive material, for instance, BN (boron nitride) and thereon conventionally a resist film is formed with a X-ray absorbent material, for instance, Au. On such account, conventional transmissive masks are physically brittle or fragile, which brings a number of problems; difficulty in handling, easy deformation due to handling or heat, complicated in manufacture and resultantly such brings a proximity apparatus to be so expensive and difficult to operate.

This invention intends to offer a mask element which comprises an X-ray absorbent patterned mask film coated on an X-ray reflective substrate capable of focusing the reflected X-ray toward image formation, and this also intends to offer a system for reproducing a pattern image onto a target plate, including said mask plate, an X-ray source and an image formation device and thereby this intends to solve the problems attendant with the art based on conventional transmission type masks.

The patterned mask element comprising X-ray reflective substrate in the present invention is summarized in that a substrate is a plate which was cut out or worked out of a crystalline substance having its original lattice surfaces for X-ray diffraction curved or arched outwardly to effect converging function to a reflecting X-ray, wherein such a crystalline body is worked out by regulating an angle assumed between curvature of lattice plates and a newly cut-out substrate face so as to maintain a direction of X-ray in conformity with Bragg's reflection (or diffraction) at a center of the substrate face to agree with normal line assumed at the same center (hereinafter "Bragg's reflection or diffraction" will be abbreviated to "Bragg"). And thereon an X-ray absorbent mask film is formed and then patterned.

As for another aspect of the invention, namely, the system for image formation with use of the mask element will be referred to in subsequent paragraphs for embodiments.

MODE(S) FOR CARRYING OUT THE INVENTION

Figure 2:
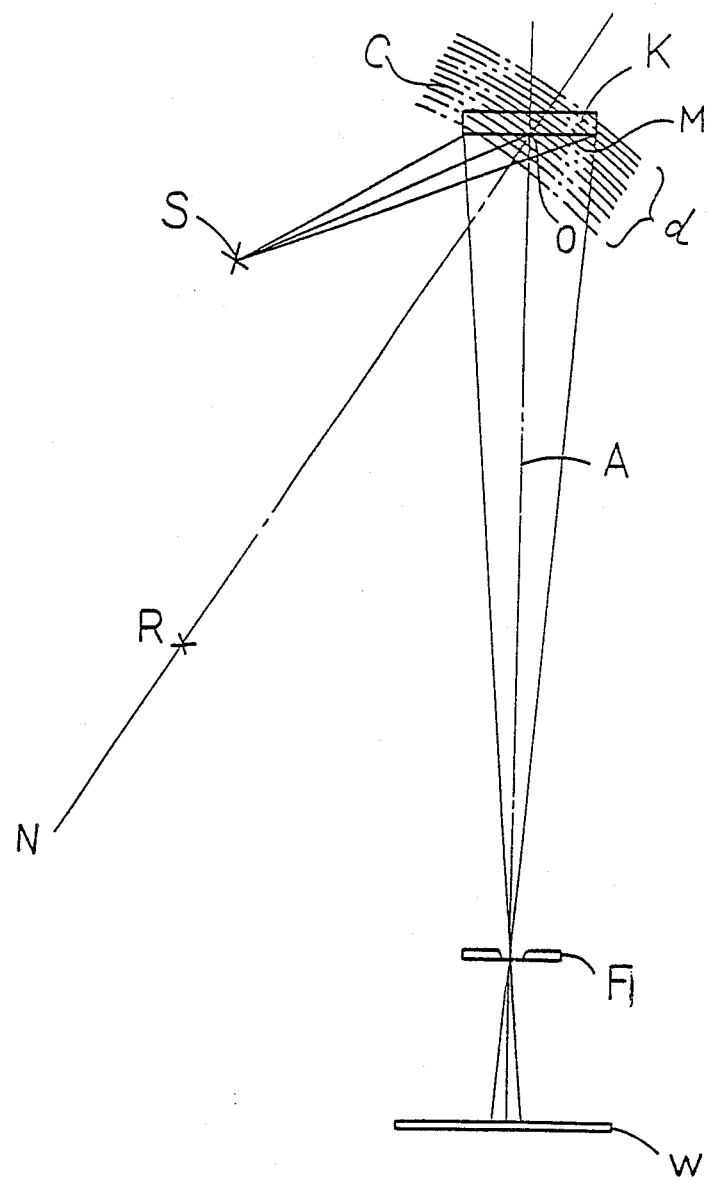
FIG. 2 is a schematic diagram, not to scale, to show an embodiment of X-ray projection and imaging system including the inventive mask element.

Summarized hereinbefore, this invention utilizes X-ray diffraction caused by lattice surfaces formed in curvature and the necessity of such curvature will be briefly explained with reference to FIG. 2. Therein, an X-ray radiated from an X-ray source S comes to be incident onto a mask element M (hereinafter M also represents a substrate face of mask film remnant on the substrate case by case) wherein X-ray portion incident directly onto substrate surface or pattern lines, where X-ray absorbent mask films was removed previously, is diffracted by lattice surfaces inside the substrate, and then reflecting or diffracted X-ray should travel to converge onto an X-ray imaging device F and therethrough a mask pattern is imaged onto a wafer W.

Figure 1:
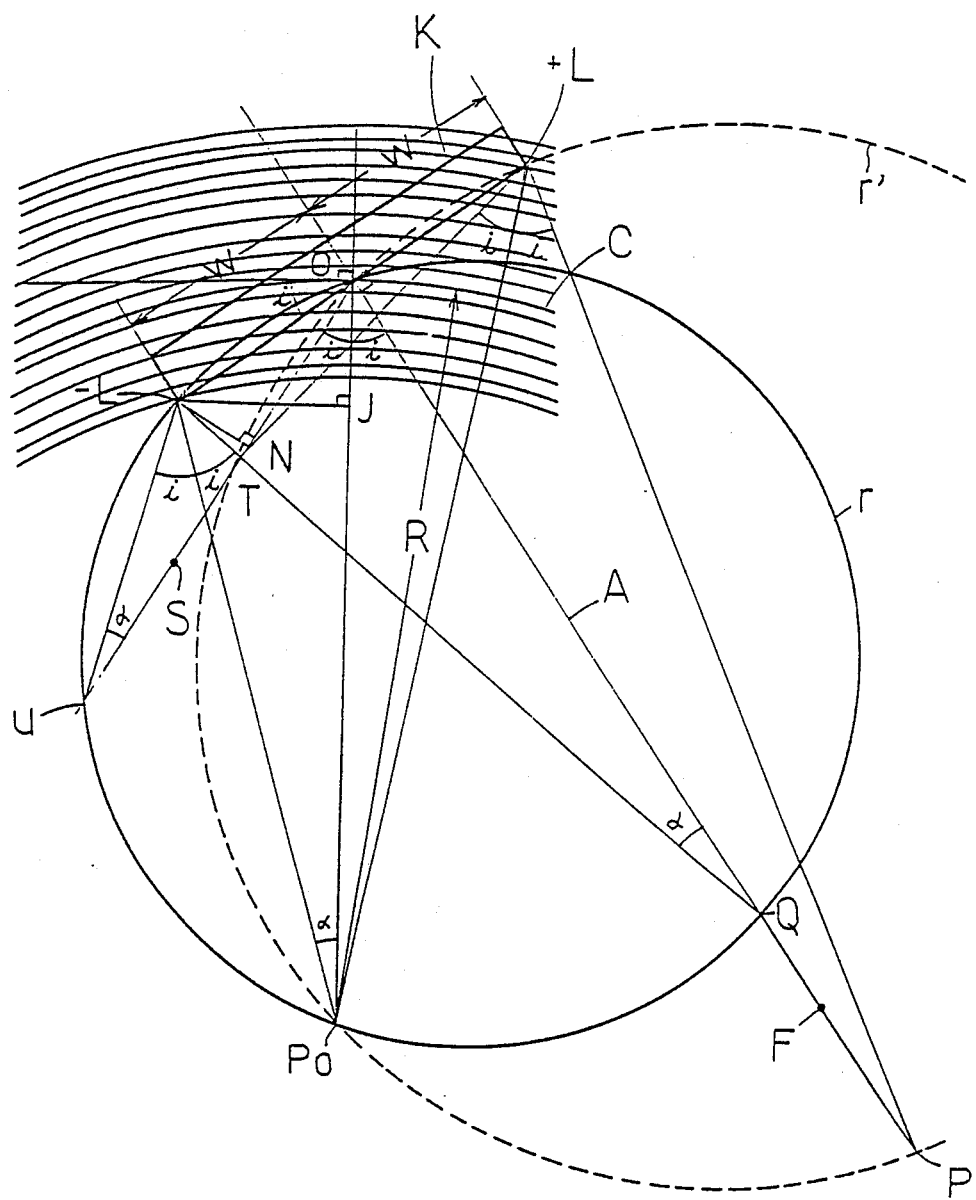
FIG. 1 is a schematic diagram to show a substrate sectionally and geometrical lines related to explain theoretical background or support involved in the present invention.

In this optical system, in order for an image formed on the wafer to be an accurate reduced reproduction of a pattern on the mask element, optical axis A in this image formation system should be vertical to the mask plane (but not vertical to lattice surfaces), which logically follows that the source S should not lie on the optical axis A. This logic leads to a key requisite that reflecting an X-ray at center O of the mask should travel coinciding with the optical axis A to reach the imaging device F. For attainment of this requisite, as FIG. 1 shows, a substrate plate is regulated in working out so that lattice surfaces C in curved crystal structure should have an inclination against cut-out surface to satisfy with the requisite above, in other words, the substrate plate K has been so designed that, if suitably incident, a diffracted X-ray at center of the plate K will travel to agree with normal line (substantially A) assumed at the same center. Consequently, the present invention allows to set the X-ray mask to face or to orient vertically to the optical axis A in the imaging system.

Proceeding to explanation of an embodiment shown in FIG. 1, therein assumed is an outwardly curved lattice structure having a lattice constant d, and also assumed is a substrate plate which was worked out of the lattice structure of which curved lattice surfaces C are on circular lines with respect to a center point $R_O$ so that face of the substrate $(-L, O, +L)$ should cross lattice surfaces C obliquely with a certain inclination to lattice surfaces retained. O is center of the mask or substrate face, R is radius of curvature for curved lattice surfaces, i is an incident angle from the X-ray source S and an F is a Fresnel zone plate (FZP), and X-ray of wavelength $\lambda$ is assumed.

U, Q represent that an X-ray starting from U and reflecting at $-L$ point (one end of the substrate) by Bragg will cross at Q with center X-ray which also starts from U to reflect at O point (center) by the same diffraction, then to follow optical axis A. Comparably, T, P represent that an X-ray starting from T and reflecting at $+L$ point (the other end thereof) by Bragg will cross at P with the same center X-ray. As will be understood, U and T lie on the same one line through O and the X-ray source S lies between T and U. On the other hand, P and Q lie on the other same line through O and the FZP F lies on between P and Q.

$P_O$ is curvature center for curved lattice surfaces C as noted above and J, N are end points of vertical lines drawn from $-L$ to a line $OP_O$ and to a line OU, which leads to that, because incident and reflective angles of an X-ray at $-L$, $+L$ and O points are all equal (i) due to the nature of lattice structure and Bragg's rule, points O, $-L$, U, $P_O$, Q are found to lie on the same circle line r and that points $+L$, O, T, $P_O$, P are also found to lie on the same circle line r'.

Then, X-ray of wavelength $\lambda$ incident onto lattice surfaces C of lattice constant d with an incident angle i is subjected to follow Bragg, which is given below:

$$2d \times \cos i = \lambda \text{(diffraction order}=1 \text{ is assumed)} \quad 1$$

Diffracting X-ray in conformity with the above requirement is enhanced or added together only in the same angle direction i by which the X-ray takes on reflection in the direction of the angle i.

It is now assumed that the substrate plate K was worked out of a curved crystal structure having the curvature radius R as shown in FIG. 1, normal line (will be proved to be the same as A later) set at the center O of the substrate face renders an angle i with respect to normal line $OP_O$ set on the lattice surfaces, which follows that setting of the X-ray source S on a line OU symmetrically opposite to the normal line A with respect to the normal line $OP_O$ will allow the normal line (substantially A) set at the center of substrate face to agree with the diffracting direction of X-ray by Bragg 1, namely, optical axis A in imaging system (see FIG. 2).

Referring to optical lines in FIG. 1, at the point $-L$ away for W from the substrate center O, it is assumed that an angle between reflecting X-ray by the Bragg ($-L$ to Q) and optical axis A is noted $\alpha$. Then the angle $\alpha$ is equal to an angle formed between a normal line set at $-L$ on lattice surfaces ($-L$ to $R_O$) and a normal line set at O on the same (O to $R_O$), which follows:

$$\tan \alpha = -LJ/R_OJ = W \times \cos i/(R - W \times \sin i) \quad 2$$

$$OQ = W/\tan \alpha \quad 3$$
$$= (R - W \times \sin i)/\cos i$$

$$OU = UN + NO$$
$$= UL \cos \alpha + W \times \sin 2i$$
$$= QL \cos 2i \times \cos \alpha + W \times \sin 2i$$

wherein $QL = OQ/\cos \alpha$, therefore $$OU = \cos 2i (R - W \times \sin i)/\cos i + W \times \sin 2i \quad 4$$
$$= (2R \cos^2 i + W \times \sin i - R)/\cos i$$

In similar way, $$OP = (R + W \times \sin i)/\cos i \quad 5$$

$$OT = \cos 2i (R + W \times \sin i)/\cos i - W \times \sin 2i \quad 6$$
$$= (2R \cos^2 i - W \times \sin i - R)/\cos i$$

These geometrical derivations teach that two X-rays reflecting by Bragg at the points $+L$, $-L$ come to cross the reflecting line (substantially A) from the center point O and that these cross points Q from $-L$ and P from $+L$ are deviated or departed and that this deviation is abberation caused by geometrical distance between $+L$ and $-L$. Then an intermediate point F may be assumed to counterbalance abberations with both source and image sides at an equal value, which will be, $$\pm W \times \tan i \quad 7$$

Therefore, an X-ray imaging device may be placed on the optical axis A at a point (substantially F) which is distant from the substrate K for a length noted below;

$$R/\cos i \quad 8$$

And a X-ray source S may be placed on a symmetrical line (substantially OU) opposite to the axis A with respect to the normal line ($OP_O$) at the substrate center O against lattice surfaces, at a point distant from the substrate center O for a length noted below;

$$(2R \times \cos^2 i - R)/\cos i \quad 9$$

A specific embodiment is given to prove the numerical basis as below: X-ray wavelength $\lambda = 5.406$ angstroms, and Ge (1 1 1) crystal surface having $d = 3.25$ angstroms and $i = 33.7$ degrees as curved crystalline structure and as substrate, size of 50 mm×50 mm and W = ±25 mm, and distance from O point to F point = 600 mm are applied.

The following calculations are derived:

The curvature radius for curved crystal structure is by the formula 8;

$$R/\cos 33.7 = 600, R = 600 \times \cos 33.7 = 499.2 \text{ mm}$$

The location (Y) of the source S is given by 9 assuming that the source should be located to balance abberations as noted;

$$Y = (2R \times \cos^2 i - R)/\cos i$$
$$= 277.2 \text{ mm}$$

Maximum abberation = 2W × tan i is given;

$$2W \times \tan i = 2 \times 25 \times \tan 33.7$$
$$= 33.3 \text{ mm}$$

Practically the maximum abberation calculated is not significant and therefore it is acceptable to use such a curved crystal structure as noted to reflection and to imaging by X-ray, for which formation of the X-ray absorbent film thereon and subsequent patterning are also acceptable to obtain X-ray reflective element in the present invention.

Making additional reference to FIG. 2, a system for performing 1/5 reduction from the mask pattern M to an image on the wafer W is assumable based on results of the calculations above which are summarized as below:

Germanium monocrystal, (1 1 1) plane, X-ray=5.406 angstroms, d=3.25 angstroms, R=499.2 mm, i=33.7 degrees, size of the substrate=50×50 mm, location of the X-ray source or OS=277.2 mm, and location of FZP (F) or OF=600 mm.

Industrial Applicability

This invention is concerned with X-ray lithography which has been applied, for instance, to reproduction of a pattern for integrated electronic circuits wherein presently the proximity method has prevailed with use of a transmissive pattern mask. But this conventional method is defective for attendant problems, for instance, difficulty in handling of fragile masks and also the inability of dimensional reduction in imaging. For merits of overcoming such difficulties with the conventional art, this invention has potential for finding industrial applications in such fields as noted above.

I claim:

1. An X-ray reflective mask element, comprising:
    an X-ray reflective substrate; and
    an X-ray absorbing mask film coated on said substrate,
    wherein the substrate has a plane face and is formed from a crystalline body which has an outwardly curved X-ray diffractive structure, and wherein the substrate face is cut out to have an inclination against diffractive lattice surfaces such that an X-ray reflected according to Bragg's rule, at the center of the substrate face, will travel to agree with a normal line also from the center of the substrate.

2. A system for X-ray projection and image formation, comprising:
    an X-ray source;
    an X-ray reflective mask element means, having an X-ray absorbing mask film coated thereon, for reflecting an incident X-ray in conformity with Bragg's rule, such that the reflected X-ray will converge at a point lying on a line normal to the center of the mask element; and
    an X-ray imaging device disposed vertical to the substrate face at the focus of the reflected X-ray.

* * * * *